United States Patent [19]

Okazaki

[11] Patent Number: 5,157,473
[45] Date of Patent: Oct. 20, 1992

[54] AVALANCHE PHOTODIODE HAVING GUARD RING

[75] Inventor: Haruhiko Okazaki, Yokohama, Japan

[73] Assignee: Kabushiki Kaisha Toshiba, Kawasaki, Japan

[21] Appl. No.: 680,858

[22] Filed: Apr. 5, 1991

[30] Foreign Application Priority Data

Apr. 11, 1990 [JP] Japan .................... 2-95470

[51] Int. Cl.⁵ .............................. H01L 27/14
[52] U.S. Cl. ...................... 357/30; 357/13; 357/52; 357/56
[58] Field of Search ........ 357/16, 30 A, 30 B, 357/30 D, 30 E, 30 L, 30 R, 56, 55, 13, 52, 52 D

[56] References Cited

U.S. PATENT DOCUMENTS

| | | | |
|---|---|---|---|
| 4,556,494 | 4/1987 | Kobayashi et al. | 357/16 |
| 4,586,067 | 4/1986 | Webb | 357/30 A |
| 4,587,544 | 5/1986 | Webb | 357/30 A |
| 4,906,583 | 3/1990 | Kagawa et al. | 357/30 A |
| 5,053,837 | 10/1991 | Tonai | 357/30 |

FOREIGN PATENT DOCUMENTS

| | | | |
|---|---|---|---|
| 0163295 | 12/1985 | European Pat. Off. | 357/30 A |
| 0343970 | 11/1989 | European Pat. Off. | 357/30 A |
| 55-72084 | 5/1980 | Japan | 357/30 A |
| 61-156777 | 7/1986 | Japan | 357/30 A |
| 61-191082 | 8/1986 | Japan | 357/30 A |
| 62-33482 | 2/1987 | Japan | 357/30 A |
| 62-48079 | 3/1987 | Japan | 357/30 A |
| 62-254473 | 11/1987 | Japan | 357/30 P |
| 63-128679 | 6/1988 | Japan | 357/30 A |
| 2-159775 | 6/1990 | Japan | 357/30 A |

OTHER PUBLICATIONS

Patent Abstracts of Japan, vol. 12, No. 193 (E-617) (3040) Jun. 4, 1988, and JP-A-62 295472 (Fujitsu Ltd) Dec. 22, 1987.
Patent Abstracts of Japan, vol. 11, No. 20 (E-472) (2467) Jan. 20, 1987 and JP-A-61 191082 (Fujitsu Ltd.) Aug. 25, 1986.
Patent Abstracts of Japan, vol. 6, No. 87 (E-108) (965) May 25, 1982 and JP-A-57 23278 (Nippon Denshin Denwa Kosha) Feb. 6, 1982.
Chi et al., "Planar InP/InGaAsP Three-Dimensional Graded Junction Avalanche Photodiode", IEEE, vol. ED-34, No. 11, Nov. 1987.

Primary Examiner—William Mintel
Assistant Examiner—Minhloan Tran
Attorney, Agent, or Firm—Oblon, Spivak, McClelland, Maier & Neustadt

[57] ABSTRACT

For providing an avalanche photodiode having a good guard ring effect and a high speed response, a body of semiconductor materials is prepared, which includes a window layer of n-type InP epitaxially grown on an avalanche multiplication layer of $n^+$-type InP. The window layer is selectively removed so as to expose the avalanche multiplication layer, thereby providing a recessed portion therein. After a p-type impurity is selectively introduced into the window layer to form a guard ring therein, a p-type impurity is selectively introduced into both the exposed avalanche multiplication layer and the guard ring to provide a PN junction therein.

14 Claims, 6 Drawing Sheets

AVALANCHE PHOTODIODE HAVING GUARD RING

BACKGROUND OF THE INVENTION

1. Field of the Invention

This invention relates to an avalanche photodiode having a satisfactory guard ring effect and a high speed response, and a method of making the same.

2. Description of the Related Art

Nowadays, III-V avalanche photodiodes (abbreviated as APD) have been widely used as semiconductor light receiving devices for high speed optical communication in a long distance. The photodiode is responsive to light in a wavelength (1 to 1.6 μm) in which a transmission loss of an optical fiber is low.

In the III-V avalanche photodiode (APD), a dark current flowing through an InGaAs layer is abruptly increased by a tunnelling current, when a high electric field is applied thereto. Usually, to avoid this, an InP layer having a wide band gap, in which a tunnelling current is rarely generated, is used as an avalanche region, and the InGaAs layer of a low carrier concentration (low impurity concentration) is used, so that a high electric field may not be applied to the InGaAs layer [SAM(Separated Absorption and Multiplication)-APD].

Figure 6:
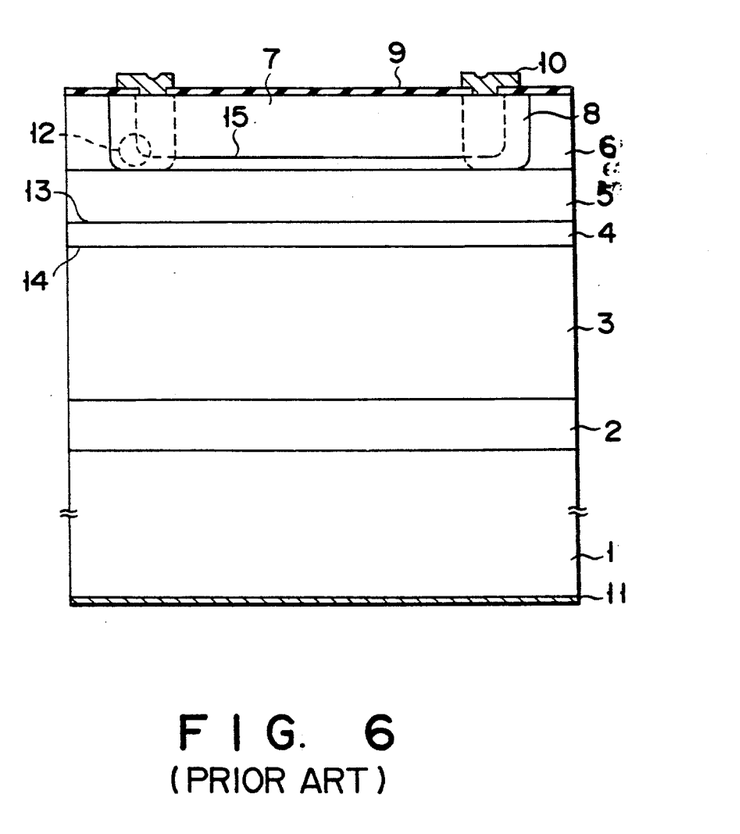
FIG. 6 is a cross sectional view showing a conventional avalanche photodiode.

FIG. 6 shows a conventional SAM-APD, in which an n-type InP buffer layer 2, an n⁻-type InGaAs light absorption layer 3, an n-type InGaAsP intermediate layer 4, an n⁺-type avalanche InP multiplication layer 5, and an n-type InP window layer 6 are epitaxially grown in sequence on an n⁺-type InP substrate 1. A p⁺-type diffusion layer 7 and a p-type guard ring 8 are formed in the window layer 6 by selective diffusion or ion implantation techniques. An anti-reflection film 9 and a P-side electrode 10 are provided on top of the upper surface of the substrate 1, and an N-side electrode 11 is formed on the lower surface of the substrate 1.

In the SAM-APD thus formed, carriers generated by light absorption in the n⁻-type InGaAs layer 3 are moved by drift to the n⁺-type InP layer 5 to perform the avalanche multiplication. Therefore, the tunnel current is suppressed, whereby the APD with the low dark current is obtained. However, since a heterojunction is formed between the InGaAs layer 3 and the InP layer 5, holes generated by the light absorption are accumulated in the barrier of a valence band existing on the heterojunction, resulting in a low response. To overcome the disadvantage, the intermediate layer 4 is interposed between the n⁻-type InGaAs layer 3 and the n⁺-type InP layer 5, thereby reducing the barrier of the valence band. The composition of the intermediate layer 4 is given to have an intermediate energy gap between those of the n⁻-type InGaAs layer 3 and the n⁺-type InP layer 5.

For realizing an APD of a low dark current and a high avalanche multiplication factor, it is necessary that uniform avalanche multiplication is performed over the entire light receiving surface, and that no voltage breakdown occurs in the region other than the light receiving region. Since the electric field tends to concentrate particularly in a curved portion 12 of a PN junction 15 between the n-type InP layer 6 and the p⁺-type InP layer 7, the voltage breakdown may occur locally (called edge breakdown). To prevent the local voltage breakdown, an APD has been proposed which includes a guard ring 8 at the peripheral portion of the PN junction 15.

In general, the edge breakdown does not occur more easily in a graded junction, in which the impurity concentration of a semiconductor region near the PN junction varies linearly, than in an abrupt step junction in which the impurity concentration varies in a stepping manner. Therefore, usually, the PN junction in the light receiving portion is provided by the abrupt step junction, and that in the guard ring portion is given by the graded junction.

In the conventional APD as described above, the n-type InP window layer 6 of the low carrier concentration is epitaxially grown on the n⁺-type InP avalanche multiplication layer 5 of the high carrier concentration. The PN junction between the layer 6 and the guard ring 8 is formed by implanting Be ions or the like into the layer 6 and annealing the implanted region at a high temperature. The PN junction 15 in the light receiving portion is formed by selective diffusion techniques, using Cd₃P₂ as a diffusion source.

In order to obtain the guard ring effect in the conventional APD, it is necessary that the PN junction of the light receiving portion be formed at a shallow position of the n-type InP window layer 6, and the PN junction of the guard ring 8 be formed at a position deeper than the curved portion of the PN junction of the light receiving portion.

On the other hand, in order to obtain a high response, it is necessary that the carrier concentration of the InP avalanche multiplication layer 5 is increased to reduce the avalanche build-up time, and the electric field applied to the heterojunctions 13 and 14 is increased to prevent the storage of holes. For this reason, the PN junction of the light receiving portion is formed in a portion which enables the guard ring effect to be obtained, and as deep as possible near the n⁺-type InP avalanche multiplication layer 5.

The thickness of the n⁺-type InP avalanche multiplication layer 5 is determined in accordance with the controllability and uniformity of the crystal growth, and the depth of the PN junction 1 formed in the n-type InP window layer 6 is determined by the controllability of the diffusion. Therefore, for providing an APD having a satisfactory guard ring effect and a high speed response, controllability and reproducibility of the thickness of the layer 5 and the depth of the PN junction 15 become important. At any rate, the manufacturing process is complicated and the manufacturing yield is apt to become low.

As described above, in the conventional APD, in order to obtain the satisfactory guard ring effect, the depth of the guard ring must be greater than that of the flat portion of the PN junction in the n-type InP window layer. Moreover, for improving the high speed response, the PN junction in the n-type InP window layer must be formed as deep as possible near the n⁺-type InP avalanche multiplication layer. The depth of the PN junction and the thickness of the n⁺-InP avalanche multiplication layer adapted to the above conditions cannot be controlled or reproduced satisfactorily, resulting in low response and manufacturing yield.

SUMMARY OF THE INVENTION

Accordingly, an object of the present invention is to provide an avalanche photodiode having a satisfactory guard ring effect and a high speed response.

Another object of the present invention is to provide a method of making the avalanche photodiode at a high yield.

According to an aspect of the present invention, there is provided an avalanche photodiode which includes a window layer of n-type InP provided on an avalanche multiplication layer of n+-type InP, a tapered recessed portion formed in the window layer to expose the surface of the avalanche multiplication layer, a semiconductor layer of n+-type InP provided in the avalanche multiplication layer to define a PN junction therebetween, and a p-type guard ring provided in the window layer.

According to another aspect of the present invention, there is provided a method of manufacturing the avalanche photodiode according to a principle incorporated in the firstly referred aspect of the present invention.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

Embodiments of the present invention will now be described with reference to the accompanying drawings.

Figure 1:
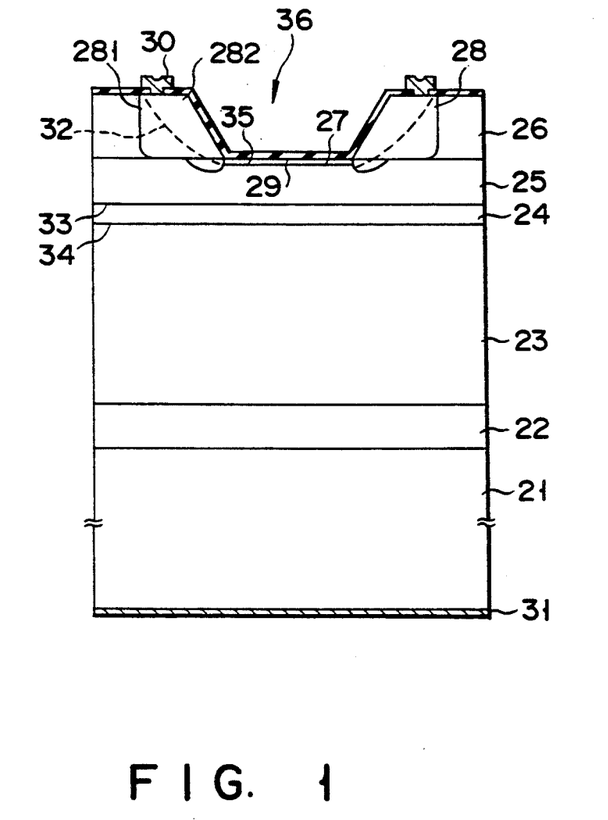
FIG. 1 is a cross sectional view showing an avalanche photodiode according to a first embodiment of the present invention.

FIG. 1 is a cross sectional view showing an avalanche photodiode according to a first embodiment of the present invention. An n-type InP buffer layer 22, an n−-type InGaAs optical absorption layer 23, an n-type InGaAsP intermediate layer 24, an n+-type InP avalanche multiplication layer 25 and an n-type InP window layer 26 are provided in sequence on an n+-type InP substrate 21 by epitaxial growth. A tapered recessed portion 36 having a flat bottom is formed in the window layer 26 to expose the surface of the avalanche multiplication layer 25. A p+-type InP layer 27 is formed in the exposed n+-type InP avalanche multiplication layer 25 to provide a PN junction 35 which serves as a light receiving portion. A p-type guard ring 28 is formed in the n-type InP window layer 26, and includes a region 281 and a region 282 defined by a dotted line 32. The region 282 has a impurity concentration greater than that of the region 281. The high impurity concentration region 282 is formed by a p-type impurity, which is introduced into the guard ring 28 during the process of forming the p+-type InP layer 27. An annular P-side electrode 30 is provided on the high impurity concentration region 282 of the p-type guard ring 28. An anti-reflection film 29 is formed on the upper surface of the semiconductor body having the light receiving portion. An N-side electrode 31 is formed on the lower surface of the semiconductor substrate 21.

Figure 2A:
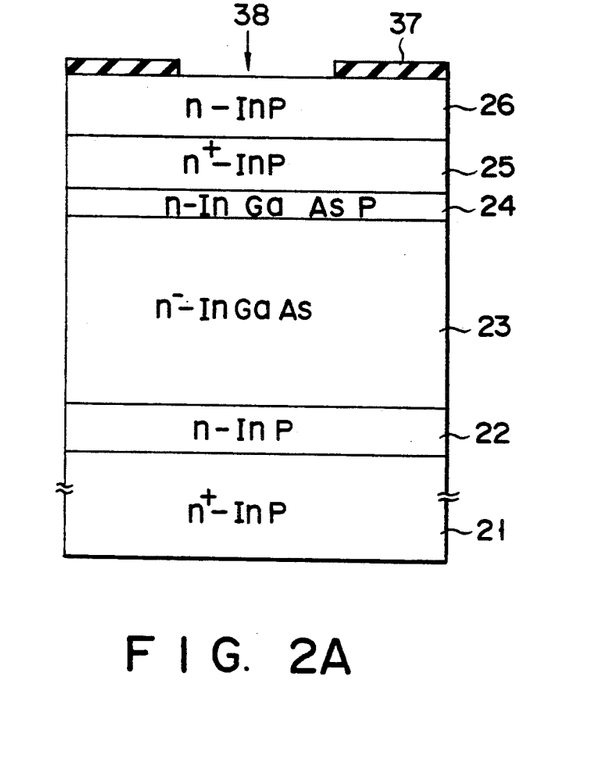
FIGS. 2A to 2E are cross sectional views showing a process for making the avalanche photodiode of FIG. 1.
Figure 2B:
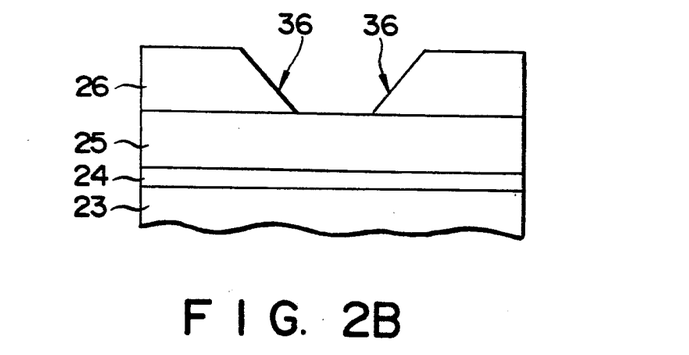

A method of making the avalanche photodiode of the above embodiment will now be described with reference to FIGS. 2A to 2E. Referring to FIG. 2A, first, an n-type InP buffer layer 22, an n−-type InGaAs light absorption layer 23, an n-type InGaAsP intermediate layer 24, an n+-type InP avalanche multiplication layer 25 and an n-type InP window layer 26 are grown in sequence on an n+-type InP substrate 21 by vapor phase epitaxy (VPE) techniques. Then, $SiO_2$ or the like is deposited on the window layer 26 to form an $SiO_2$ film 37, a part of which is removed by photoetching techniques, thereby forming a circular opening 38 therein. Using the $SiO_2$ film as a mask, the n-type InP window layer 26 is selectively removed by an etchant of $Br-CH_3OH$ or the like, thereby forming a tapered recessed portion 36 to expose a part of the surface of the avalanche multiplication layer 25. Thereafter, the $SiO_2$ mask 37 is removed (FIG. 2B).

Figure 2C:
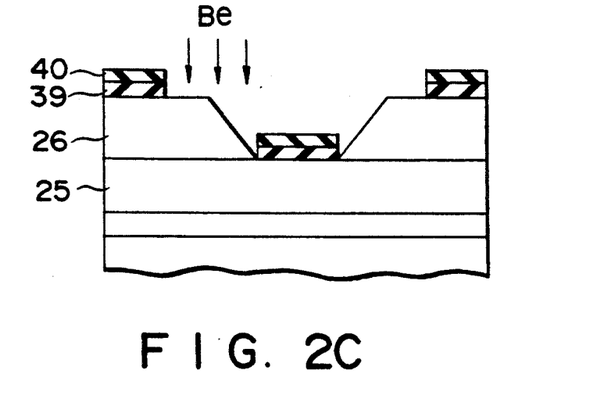

Next, referring to FIG. 2C, an $SiO_2$ film 39 and a resist film 40 is formed in sequence on the window layer 26 and the exposed portion of the avalanche multiplication layer 25. Thereafter, these films are patterned to expose the window layer 26 near the recessed portion 36. A p-type impurity such as beryllium (Be) is ion of 200kV and a dosage of about $1 \times 10^{13}$ cm$^{-2}$, using the patterned $SiO_2$ film 39 and the resist film 40 as a mask.

Figure 2D:
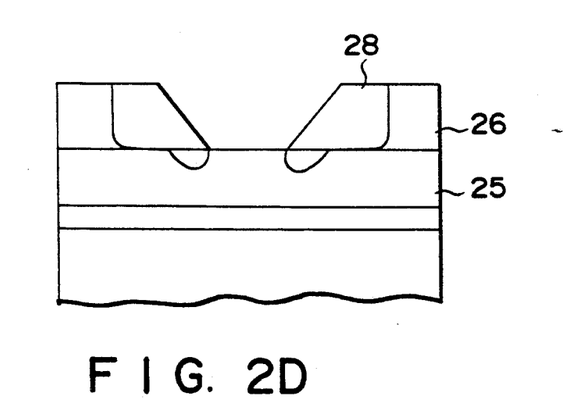

Next, as shown in FIG. 2D, after the resist film 40 and the $SiO_2$ film 39 are removed, the semiconductor body is annealed in a phosphine atmosphere (10000ppm) at 700° C. for 10 minutes, thereby forming a p-type guard ring 28 in the window layer 26.

A part of the p-type guard ring 28 extends into the avalanche multiplication layer 25 so as to be defined by the peripheral edge of the bottom of the tapered recessed portion 36.

Figure 2E:
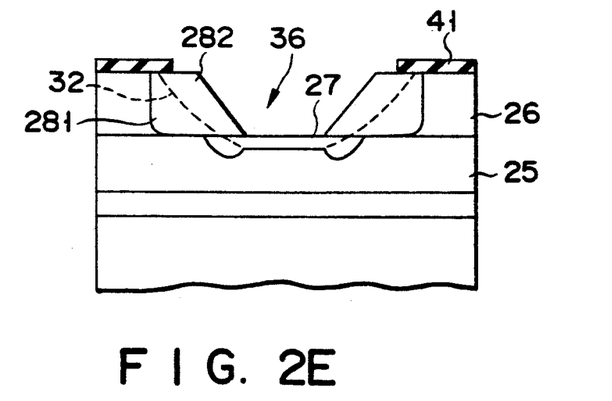

Thereafter, as shown in FIG. 2E, an $SiN_x$ film 41 is formed on the substrate surface, and selectively etched so as to expose the recessed portion 36. Then, a p-type impurity such as cadmium (Cd) is selectively diffused into the window layer 26, using the $SiN_x$ film 41 as the mask. In the diffusion step, the p-type impurity is diffused into the n+-type InP avalanche multiplication layer 25 as indicated by a dotted line 32, thereby forming a p+-type InP layer 27 whose depth is shallower than a part of the p-type guard ring 28 diffused into the avalanche multiplication layer 25. At the same time, the region 282 having an impurity concentration higher than that of the region 281 is formed in the p-type guard ring 28 as defined by the dotted line 32.

After forming an $SiN_x$ film serving as an antireflection film 29 as shown in FIG. 1, the $SiN_x$ film is selectively removed to expose a part of the region 282 of the p-type guard ring 28. Electrode metal is evaporated on the substrate surface by vacuum evaporation techniques, and patterned by photoengraving techniques to remove an unmasked portion of the electrode metal. As a result, a P-side electrode 30 is provided on the region 282 of the p-type guard ring 28. Subsequently, the lower surface of the InP substrate 21 is polished, and an N-side electrode 31 is formed thereon by vacuum evaporation techniques. Finally, for providing ohmic contact electrodes, heat treatment is performed. In this way, an avalanche photodiode is completed.

Figure 3:
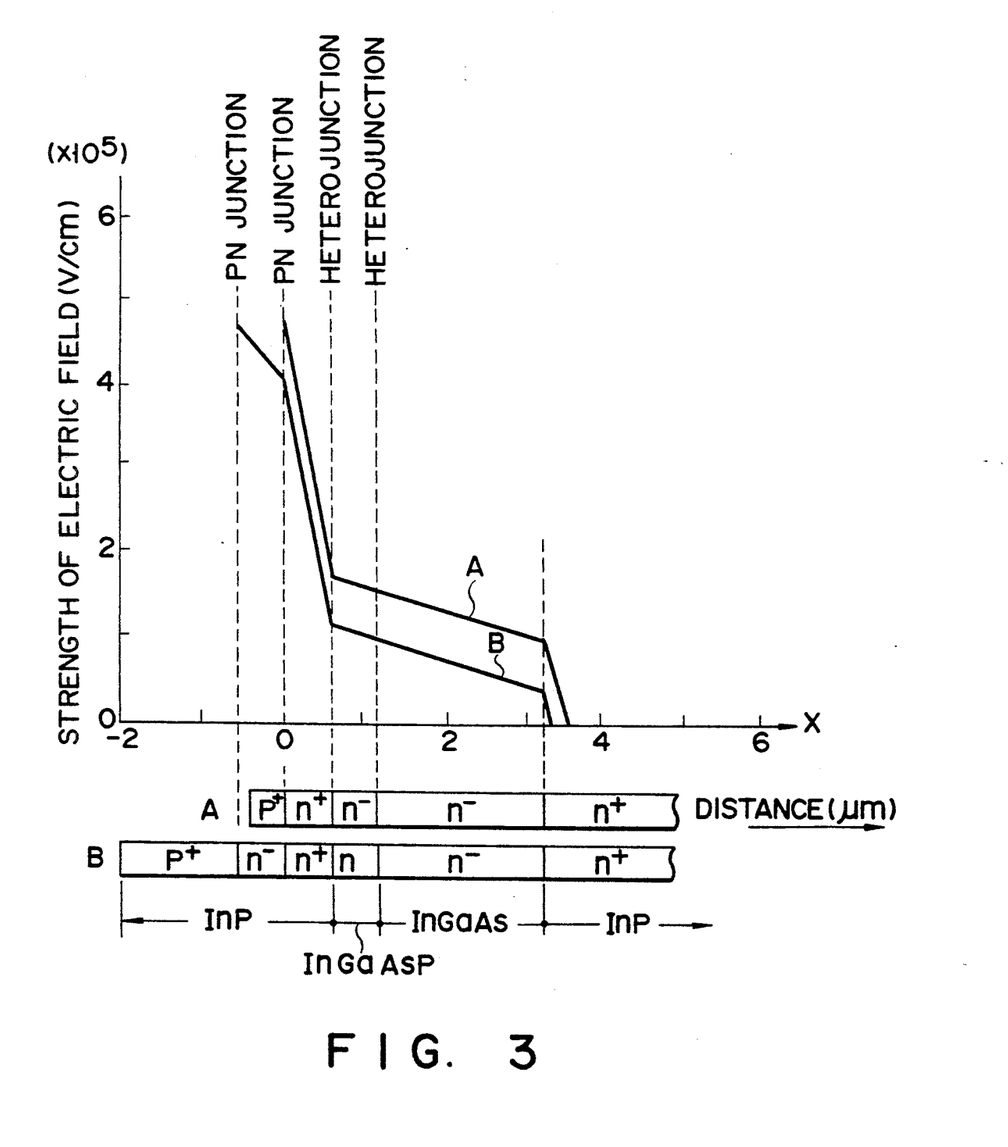
FIG. 3 is a diagram schematically showing field strength of semiconductor layers in the avalanche photodiode shown in FIG. 1 and a conventional avalanche photodiode.

FIG. 3 schematically shows electric field distribution of the n-type layers under the flat P junction of the light receiving portion of the present invention. FIG. 3 also shows electric field distribution of the avalanche photodiode shown in FIG. 6 for comparison. The abscissa x represents a distance (μm) in the direction perpendicular to the substrate surface. A reference point (x=0) is given by the PN junction of the avalanche photodiode according to the present invention. The arrangements of the semiconductor layers corresponding to the distance x are shown under the abscissa and in parallel therewith. The arrangements A and B represent the present invention and the conventional example, respectively. The ordinate represents intensity (V/cm) of the electric field. Polygonal lines A and B show a relationship between the distance x and the intensity of the electric field in the present invention and in the conventional device, respectively.

As shown in FIG. 3, since the PN junction of the light receiving portion in the conventional device is formed in the n-type InP window layer, the electric field applied to the heterojunctions is lowered. Moreover, since the n-type InP window layer has a low impurity concentration in general, the avalanche buildup time therein tends to become long. In contrast, in the avalanche photodiode according to the present invention, since the PN junction is formed in the n+-InP avalanche multiplication layer, not in the n-type InP window layer, the avalanche build-up time will be reduced. Further, since the electric field applied to the heterojunctions is increased, it will be possible to prevent holes from accumulating at the heterojunctions. For these reasons, a high speed response can be obtained.

Regarding the curved portion (given by the dotted line 32) of the PN junction in which edge breakdown easily occurs, since the surface in the recessed portion of the window layer is subjected to the diffusion or ion implantation, the curvature of the curved portion can be increased (the radius of curvature can be increased), even if the avalanche multiplication layer is shallowly doped with the impurity. Thus, the edge breakdown will be suppressed. Moreover, the impurity is introduced into the recessed portion through its periphery and side wall to form the curved portion of the PN junction, thereby providing the guard ring. Therefore, the curved portion having the small curvature can be formed at the position deeper than the flat portion of the PN junction. For these reasons, the satisfactory guard ring effect will be obtained, and the edge breakdown will be suppressed.

More specifically, the impurity (Be) is selectively introduced into the recessed portion 36 of the window layer 26 through its periphery having the side wall (FIGS. 2D and 2E), thereby forming the guard ring 28 in the window layer 26. Subsequently, the impurity (Cd) is selectively introduced into both the guard ring 28 and the avalanche multiplication layer 25 to provide the PN junction 35 in the light receiving portion. Therefore, the edge breakdown can be easily suppressed, and the satisfactory guard ring effect can be obtained.

Further, since the thickness of the p-type InP layer 27 provided in the n+-type InP avalanche multiplication layer 25 is controlled by the selective diffusion process or ion implantation method, the satisfactory controllability and reproducibility of the thickness will be obtained. Moreover, the avalanche photodiode can be manufactured easily at the high yield.

Figure 4:
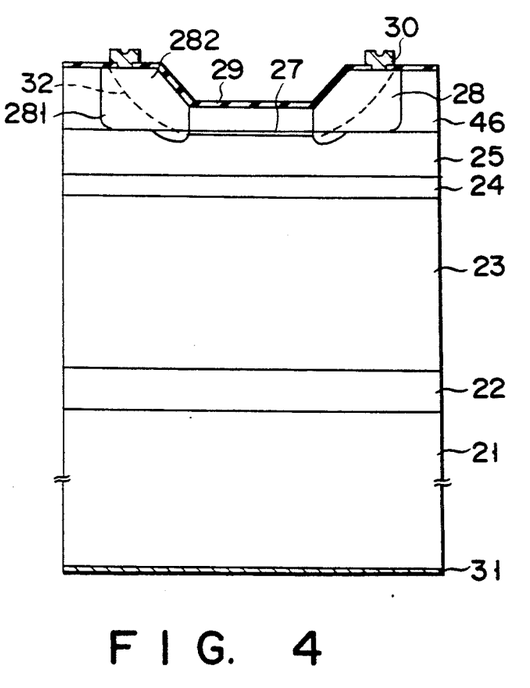
FIG. 4 is a cross sectional view showing an avalanche photodiode according to a second embodiment of the present invention.

FIG. 4 is a cross sectional view showing a second embodiment of the present invention. While in the first embodiment shown in FIG. 1 the n-type InP window layer 26 is etched to form the recessed portion so as to expose the layer 25, an n-type InP window layer 46 in the second embodiment is etched to form a recessed portion therein. That is, the window layer 46 is selectively removed so as not to expose the avalanche multiplication layer 25. Accordingly, the controllability of diffusion of the p+-type InP layer 27 will be improved.

Figure 5:
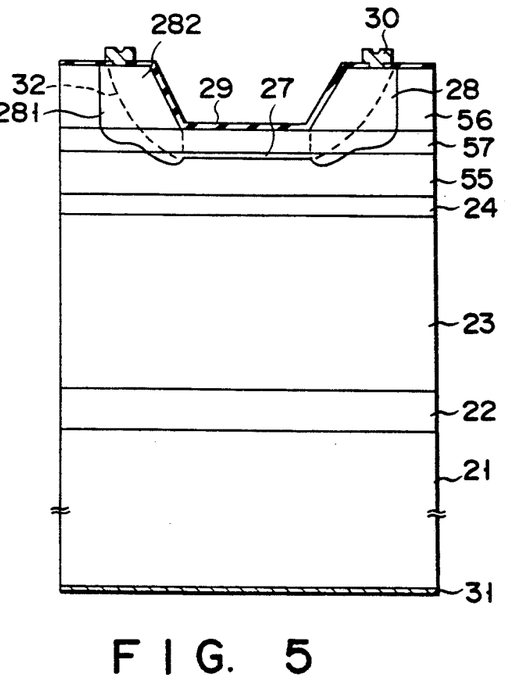
FIG. 5 is a cross sectional view showing an avalanche photodiode according to a third embodiment of the present invention.

FIG. 5 is a cross sectional view showing a third embodiment of the present invention. In this embodiment, an n-type InGaAsP layer 57 serving as a stopper in the step of selectively etching the window layer is interposed between an n-type InP window 56 and an n+-type InP avalanche multiplication layer 55. When the window layer is etched by hydrochloric acid, the InGaAsP layer stops progress of the etching, thereby improving the controllability of etching.

Although the above embodiments relate to a semiconductor device formed of InGaAsP/InP system compound semiconductor, the present invention can be applied to semiconductor devices formed of AlGaAsSb, GaAs and the like. In addition, the p-type layers and the n-type layers of the present invention may be replaced by n-type layers and p-type layers, respectively. Further, the PN junction in the light receiving portion, which is formed by diffusion in the above embodiments, can be formed by the ion implantation of zinc (Zn), magnesium (Mg), or the like.

It is further understood by those skilled in the art that the foregoing description is preferred embodiments of the disclosed photodiodes and that various changes and modifications may be made in the invention without departing from the spirit and scope thereof.

What is claimed is:

1. An avalanche photodiode comprising:
   a semiconductor body of one conductivity type including a window layer provided on an avalanche multiplication layer;
   a tapered recessed portion having a flat bottom and formed in said window layer;
   a guard ring of an opposite conductivity type formed in said window layer, a part of said guard ring extending into said multiplication layer to be defined by a peripheral edge of said flat bottom; and
   a semiconductor layer of an opposite conductivity type provided in said avalanche multiplication layer to define a pn junction therein, a peripheral edge of said pn junction being surrounded by said part of said guard ring.

2. The avalanche photodiode according to claim 1, wherein a pn junction formed between the guard ring and the avalanche multiplication layer is formed at a greater depth than the pn junction provided between said avalanche multiplication layer and said semiconductor layer of the opposite conductivity type.

3. The avalanche photodiode according to claim 1, wherein said tapered recessed portion is formed in said window layer to expose said avalanche multiplication layer.

4. The avalanche photodiode according to claim 1, wherein said tapered recessed portion is formed in said window layer to a desired depth.

5. The avalanche photodiode according to claim 1, wherein said guard ring includes a first region and a second region having a higher impurity concentration than that of said first region.

6. The avalanche photodiode according to claim 5, wherein a P-side electrode is in contact with said second region of said guard ring.

7. The avalanche photodiode according to claim 1, wherein said avalanche multiplication layer is comprised of an n+-type InP material and said window layer is comprised of n-type InP material.

8. The avalanche photodiode according to claim 7, wherein said semiconductor body includes an n+-type InP substrate on which an n-type InP buffer layer, an n-type InGaAs absorption layer and an n-type InGaAsP intermediate layer are successively provided.

9. The avalanche photodiode according to claim 7, wherein said avalanche multiplication layer of said n+-type InP is provided on said n-type InGaAsP intermediate layer.

10. The avalanche photodiode according to claim 1, wherein said semiconductor layer is comprised of a p+-type InP material.

11. The avalanche photodiode according to claim 1, wherein an antireflection film is provided to cover a surface of said semiconductor body except said P-side electrode.

12. The avalanche photodiode according to claim 1, wherein a stopper layer is provided between said avalanche multiplication layer and said window layer.

13. The avalanche photodiode according to claim 12, wherein said stopper layer is comprised of n-type InGaAsP.

14. The avalanche photodiode according to claim 12, wherein said tapered recessed portion is formed in said window layer to expose said stopper layer.

* * * * *